United States Patent [19]
Wong et al.

[11] Patent Number: 6,101,093
[45] Date of Patent: *Aug. 8, 2000

[54] WRAP AROUND CLIP FOR AN ELECTRONIC CARTRIDGE

[75] Inventors: Thomas J. Wong, Seattle; Michael T. Crocker, Tacoma, both of Wash.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/140,871

[22] Filed: Aug. 27, 1998

[51] Int. Cl.⁷ ....................................................... H05K 7/20
[52] U.S. Cl. ......................... 361/709; 361/704; 361/707; 361/720; 257/707; 257/713; 174/16.3; 165/80.3
[58] Field of Search ....................................... 361/704–710, 361/714–720, 785, 690, 722, 752; 257/706–727; 165/80.3, 185, 165; 174/16.3; 24/457, 453, 458, 470; 267/150, 158, 160

[56] References Cited

U.S. PATENT DOCUMENTS

| | | | |
|---|---|---|---|
| 4,587,595 | 5/1986 | Staples | 361/710 |
| 5,237,485 | 8/1993 | Martiis et al. | 361/712 |
| 5,815,371 | 9/1998 | Jeffries et al. | 361/704 |
| 5,847,928 | 12/1998 | Hinshaw et al. | 361/704 |
| 5,870,288 | 2/1999 | Chen | 361/704 |

*Primary Examiner*—Leo P. Picard
*Assistant Examiner*—Michael Datskovsky
*Attorney, Agent, or Firm*—Blakely, Sokoloff, Taylor & Zafman LLP

[57] ABSTRACT

An electronic assembly which includes a heat sink that is attached to a substrate by a clip. The assembly includes an integrated circuit package that is mounted to the substrate. The clip has an arm which extends around an edge of the substrate and attaches the heat sink to the substrate. The clip also presses the heat sink into the package. Attaching the heat sink directly to the package may reduce the flatness requirements of the sink and the cost of producing the assembly.

14 Claims, 4 Drawing Sheets

WRAP AROUND CLIP FOR AN ELECTRONIC CARTRIDGE

BACKGROUND OF THE INVENTION

1. Field of the Invention

The present invention relates to an electronic cartridge which has a heat sink.

2. Background Information

FIG. 1 shows a product marketed by Intel Corporation, the assignee of this application, which is referred to as a single edge contact cartridge (SECC). The Intel SECC includes a microprocessor which is assembled into a package 1 that is mounted to a substrate 2. The SECC may also have other integrated circuit packages 3 which contain static random access memory (SRAM) integrated circuits.

One edge of the substrate 2 has a plurality of conductive pads 4 which can be inserted into an electrical connector 5. The electrical connector 5 can be mounted to a printed circuit board 6 such as the motherboard of a computer. The pads 4 and connector 5 electrically couple the substrate 2 to the circuit board 6.

The substrate 2 and integrated circuit packages 1 and 3 are enclosed by a cover 7 and a thermal plate 8. The cover 7, plate 8 and substrate 2 provide an electronic cartridge which can be plugged into a computer.

The electrical system shown in FIG. 1 can be subjected to external shock and vibration loads. Such loads may produce intermittent separation between the pads 4 and the connector 5. Intermittent separation between the pads 4 and connector 5 may create electrical "opens." The system is provided with a retention mechanism 9 to secure the substrate 3 to the connector 5 and prevent contact separation under shock and vibration loads.

The retention mechanism 9 includes a pair of guide rails 10 that are mounted to the circuit board 6. Each rail 10 includes an aperture 11 which receives a latch 12 that extends from the cover 7 of the cartridge. When inserted into the aperture 11 each latch 12 prevents the substrate 2 from being pulled out of the connector 5. The substrate 3 can be unplugged from the connector 5 by pressing a pair of latch levers 13 and pulling the cartridge away from the board 6. Pressing the levers 13 moves the latches 12 out of the apertures 11 of the rails 10.

The integrated circuits generate heat which must be removed from the circuits. The thermal plate 8 is thermally coupled to the integrated circuit package 1 of the SECC to provide a thermal path for the heat generated by the microprocessor. A heat sink 14 may be mounted to the thermal plate 8 to further facilitate the removal of heat.

The heat sink 14 typically contains a plurality of fins 15 which extend from a pedestal 16. The pedestal 16 has a mounting surface 17 which mates with a corresponding surface of the thermal plate 8. The mounting surfaces of the thermal plate 8 and the heat sink 14 must be relatively flat to insure that there are no air voids when the components are assembled. Air voids will significantly increase the thermal impedance between the thermal plate 8 and the heat sink 14.

Stringent flatness requirements increase the cost of producing the heat sink and the overall assembly. It would be desirable to provide an electronic assembly similar to the SECC which has a lower cost heat sink. It would also be desirable to provide a simple low cost fastener that can attach a heat sink to the substrate and the integrated circuit packages.

SUMMARY OF THE INVENTION

One embodiment of the present invention includes an electronic assembly which may have a heat sink that is attached to a substrate by a clip. The assembly includes an integrated circuit package that is mounted to the substrate. The clip has an arm which extends around an edge of the substrate and attaches the heat sink to the substrate.

DETAILED DESCRIPTION OF THE INVENTION

One embodiment of the present invention is an electronic assembly which includes a heat sink that is attached to a substrate by a clip. The assembly includes an integrated circuit package that is mounted to the substrate. The clip has an arm which extends around an edge of the substrate and attaches the heat sink to the substrate. The clip may also press the heat sink into the package. Attaching the heat sink directly to the package may reduce the flatness requirements of the sink and the cost of producing the assembly.

Figure 1:
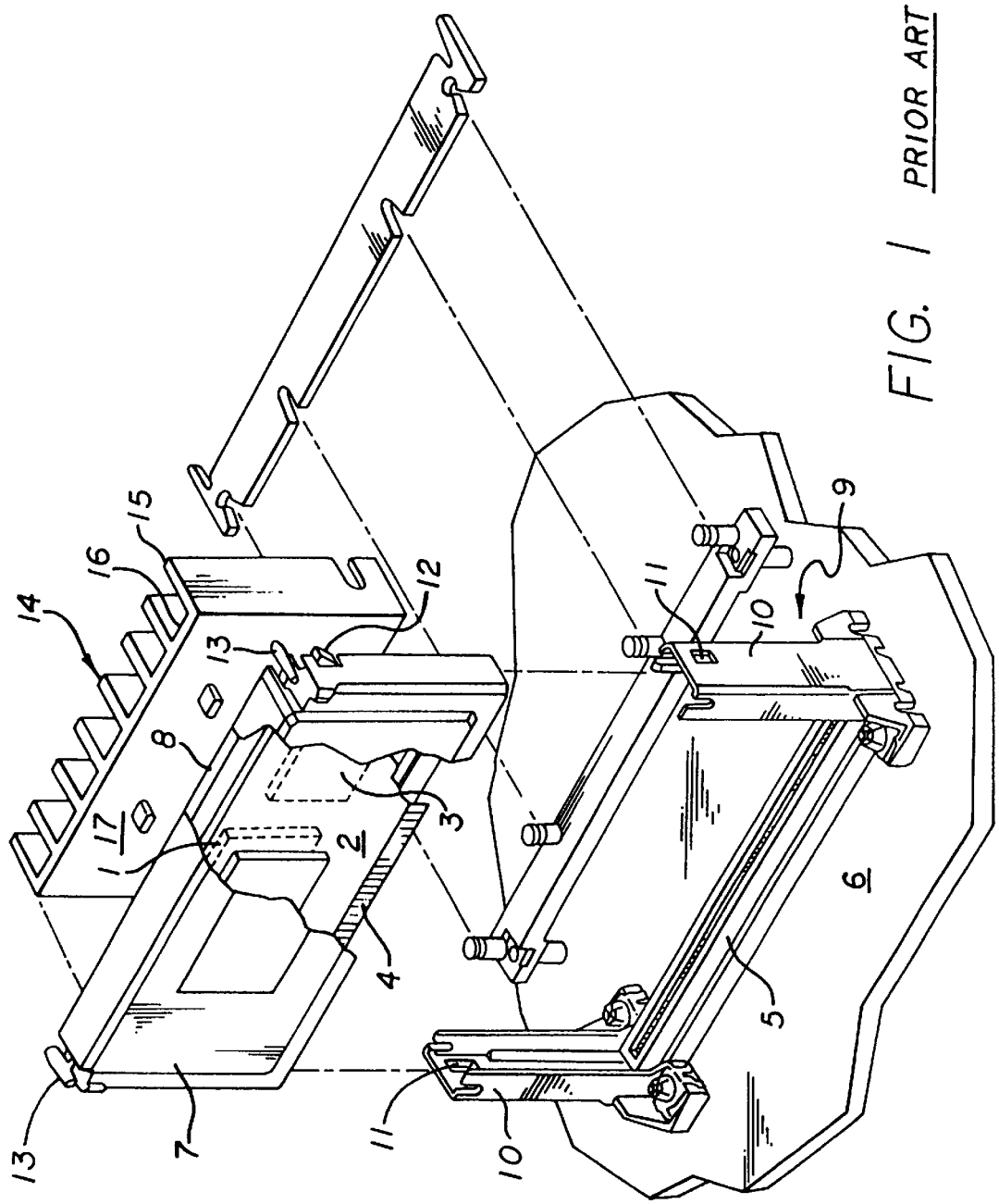
FIG. 1 is a perspective view of an electrical assembly of the prior art.
Figure 2:
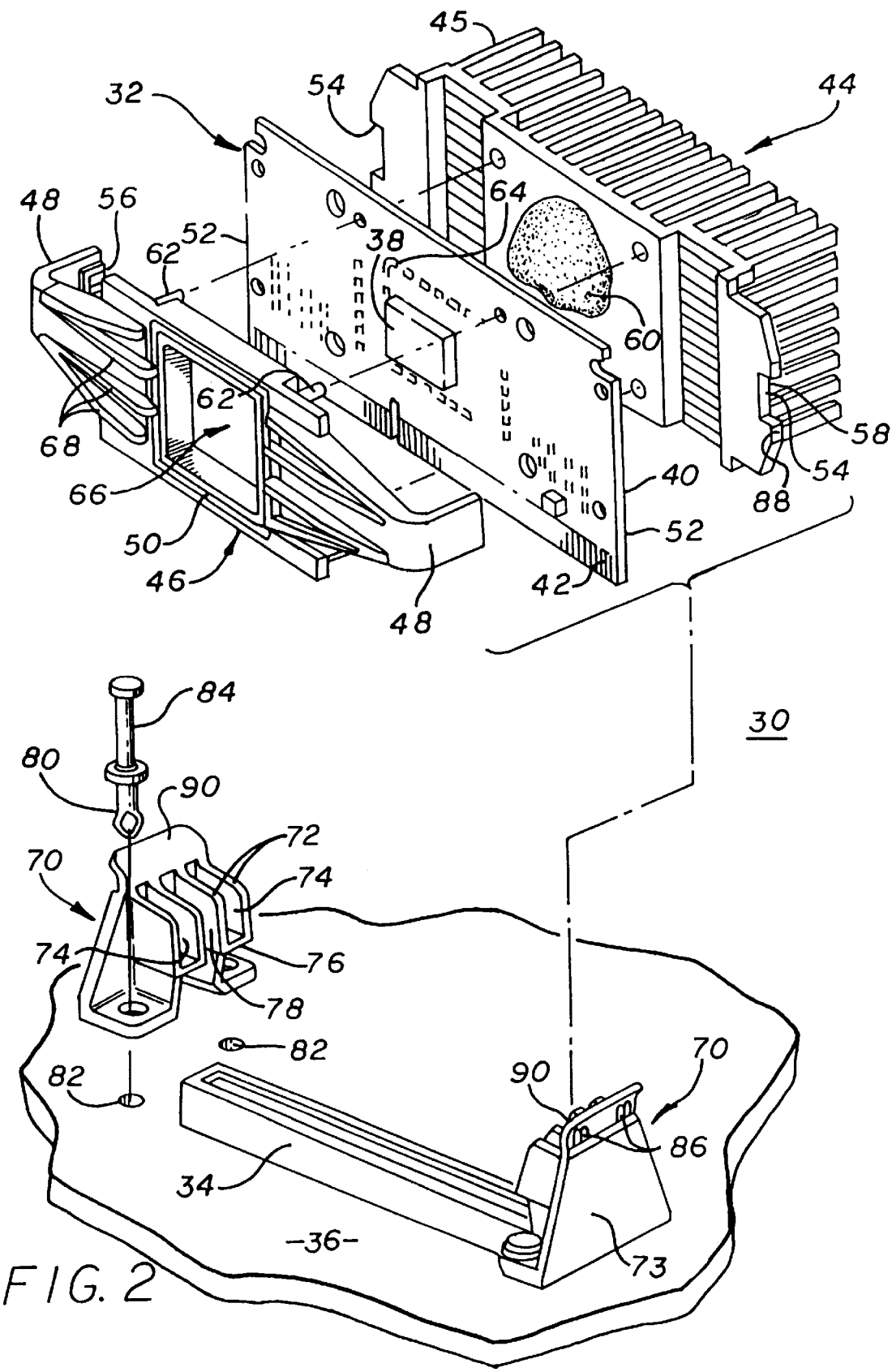
FIG. 2 is an exploded view of an embodiment of an electrical assembly of the present invention.
Figure 3:
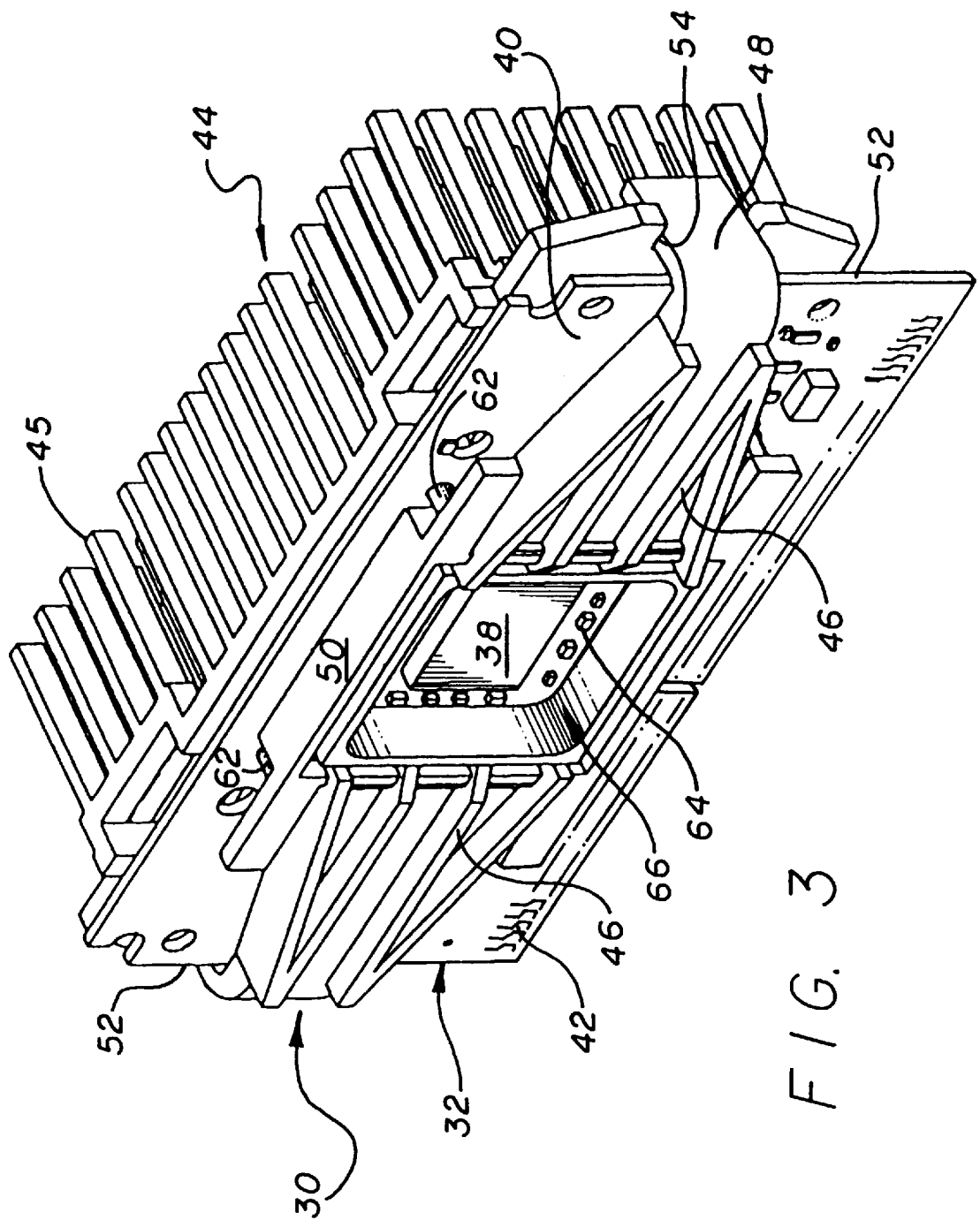
FIG. 3 is a perspective view of an assembled electronic assembly.

Referring to the drawings more particularly by reference numbers, FIGS. 2 and 3 show an embodiment of an electrical assembly 30 of the present invention. The assembly 30 includes an electronic assembly 32 that can be plugged into an electrical connector 34. The connector 34 may be mounted to a printed circuit board 36. The printed circuit board 36 may be a motherboard of a computer.

The electronic assembly 32 may include a plurality of integrated circuit packages 38 that are mounted to a substrate 40. Each integrated circuit package 38 may contain an integrated circuit (not shown) such as a microprocessor. The substrate 40 may be a printed circuit board. One edge of the substrate 40 may have a plurality of contacts 42 that can be inserted into the electrical connector 34. The substrate 40 may have routing traces, power/ground planes, vias, surface pads, etc. which electrically connect the integrated circuit package 38 to the contacts 42.

The integrated circuits within the packages 38 may generate heat that must be removed from the assembly 32. The assembly 32 may include a heat sink 44 which facilitates the removal of heat from the packages 38. The heat sink 44 is typically constructed from a thermally conductive material such as aluminum and has fins 45 to increase the effective surface area of the sink 44.

The electronic assembly 32 may include a clip 46 which attaches the heat sink 44 to the substrate 40. The clip 46 may include a pair of arms 48 that extend from a center portion 50. The arms 48 may extend around edges 52 of the substrate 40. The arms 48 may be pressed into a pair of slots 54 located at opposite ends of the heat sink 44.

Figure 4:
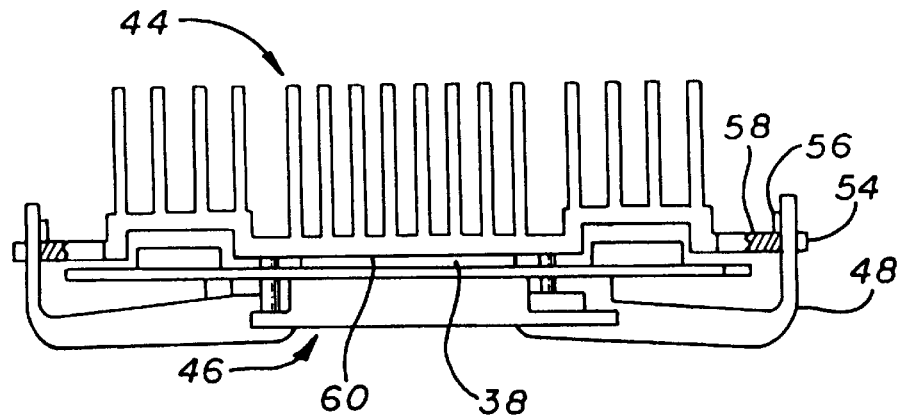
FIG. 4 is a top view showing a clip that attaches a heat sink to a substrate.

As shown in FIG. 4, the arms 48 attach the heat sink 44 to the substrate 40. Each arm 48 may have a tab 56 that "snaps" onto a rear surface 58 of the heat sink 44. The tabs 56 prevent movement of the heat sink 44 away from the substrate 40. The interlocking relationship between the arms 48 and the slots 54 also prevents lateral movement of the heat sink 44. The arms 48 may exert a force which presses the heat sink 44 into one of the integrated circuit packages 38 to provide a direct thermal path between the package and the sink 44.

Referring to FIG. 2, a thermal grease 60 may be located between the package 38 and the heat sink 44 to eliminate air voids between the components. The center portion 50 of the clip 46 may have a plurality of posts 62 that provide a spacer so that an integrated circuit package 38 and other electrical components 64 can be mounted to the substrate 40 without interference with the clip 46. The center portion 50 may also have a center opening 66 which provides additional clearance for the integrated circuit package 38.

The clip 46 may be constructed from a plastic material which is flexible enough so that the arms 48 can be bent around the substrate 40 and snapped into the heat sink slots 54. The clip 46 may have integral ribs 68 that provide structural support while allowing the arms 48 to be bent around the substrate 40.

Figure 5:
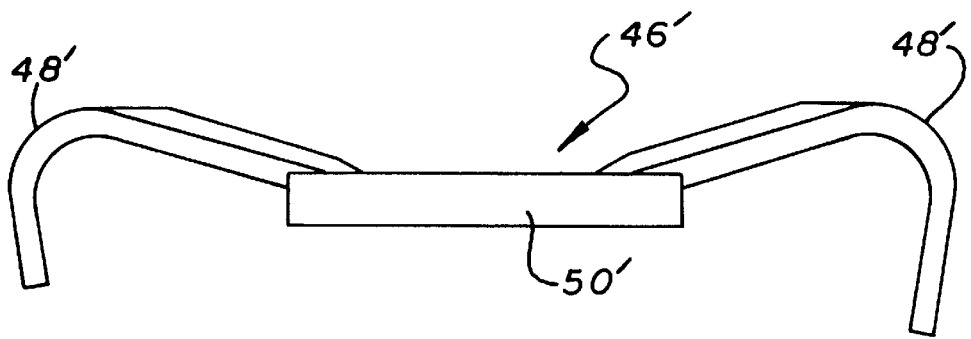
FIG. 5 is a side view of an alternate embodiment of the clip.

FIG. 5 shows an alternate embodiment of the clip 46'. The arms 48' may have taper toward the center portion 50' to insure that the clip 46' engages and exerts a spring onto the heat sink (not shown).

Referring to FIG. 2, the assembly 30 may include a pair of retention mechanisms 70 that are mounted to the printed circuit board 36. The retention mechanisms 70 retain and support the electronic assembly 32. The mechanism 70 may include a plurality of slot walls 72 which extend from a backwall 73 and are separated from each other by a pair of heat sink slots 74. The walls 72 are adjoined by a base portion 76. The heat sink 44 may be inserted into either slot 74. The walls 72 may be separated from each other by a substrate slot 78. The substrate slot 78 may provide a clearance for the substrate 40 to be pushed into the connector 34.

Figure 6:
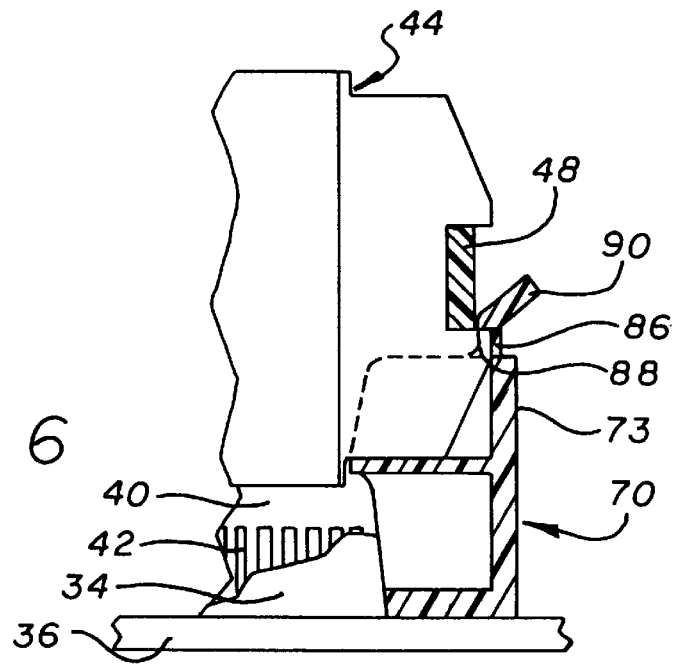
FIG. 6 is a side sectional view of a substrate and a heat sink inserted into a retention mechanism.

Each retention mechanism 70 may have a pair of studs 80 that are pressed into a pair of corresponding holes 82 in the printed circuit board 36. Pins 84 may be pressed into the retention studs 80 to expand the studs 80 and secure the retention mechanism 70 to the circuit board 36. Each retention mechanism 70 may have a pair of latch apertures 86. As shown in FIG. 6, one of the latch apertures 86 may receive a tab 88 of the heat sink 44. When inserted into the aperture 80, the tab 88 prevents the electronic assembly 32 from being pulled out of the connector 34. To remove the assembly 32 an operator can depress a latch arm 90 so that the tab 88 is separated from the retention mechanism 70. For an assembly 30 with two retention mechanism 70 the operator can decouple tabs 90 that are located on both sides of the heat sink 44. Once the tabs 88 are decoupled from the retention mechanisms 70 the operator can pull the substrate 40 out of the connector 34.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:

a substrate which has an edge;

an integrated circuit package mounted to said substrate;

a heat sink that is located adjacent to said substrate; and, a clip which has an arm that extends around said edge of said substrate and attaches said heat sink to said substrate, said clip has a center portion that engages said substrate and separates said clip from said integrated circuit package.

2. The assembly as recited in claim 1, wherein said clip exerts a spring force that presses said heat sink into said integrated circuit package.

3. The assembly as recited in claim 1, wherein said arm extends from a center portion.

4. The assembly as recited in claim 1, wherein said heat sink has a slot that receives said arm of said clip.

5. The assembly as recited in claim 4, wherein said arm includes a tab that captures said heat sink.

6. The assembly as recited in claim 1, wherein said substrate has a plurality of contacts along an edge of said substrate.

7. An electronic assembly, comprising:

a substrate which has a pair of edges;

an integrated circuit package mounted to said substrate;

a heat sink that is located adjacent to said substrate, said heat sink having a pair of slots; and, a clip which has a pair of arms that extend from a center portion, said arms extend around said substrate edges and into said heat sink slots, said center portion engages said substrate and separates said clip from said integrated circuit package.

8. The assembly as recited in claim 7, wherein said clip exerts a spring force that presses said heat sink into said integrated circuit package.

9. The assembly as recited in claim 7, wherein each arm includes a tab that captures said heat sink.

10. The assembly as recited in claim 7, wherein said substrate has a plurality of contacts along an edge of said substrate.

11. A method for assembling an electronic assembly, comprising:

a) extending an arm of a clip around an edge of a substrate;

b) attaching said arm to a heat sink wherein a center portion of said clip engages said substrate and separates said clip from an integrated circuit package.

12. The method as recited in claim 11, further comprising the step of inserting said substrate into a connector that is mounted to a printed circuit board.

13. The method as recited in claim 12, wherein said heat sink is latched into a retention mechanism when said substrate is inserted into said connector.

14. The method as recited in claim 12, wherein said substrate in inserted into a substrate slot and said heat sink is inserted into a heat sink slot of said retention mechanism when said substrate is inserted into said connector.

* * * * *